United States Patent
Ishikawa et al.

(10) Patent No.: US 11,328,933 B2
(45) Date of Patent: May 10, 2022

(54) ETCHING METHOD, SUBSTRATE PROCESSING APPARATUS, AND SUBSTRATE PROCESSING SYSTEM

(71) Applicant: Tokyo Electron Limited, Tokyo (JP)

(72) Inventors: Shinya Ishikawa, Miyagi (JP); Kenta Ono, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/952,086

(22) Filed: Nov. 19, 2020

(65) Prior Publication Data

US 2021/0202260 A1 Jul. 1, 2021

(30) Foreign Application Priority Data

Dec. 26, 2019 (JP) .............................. JP2019-236675

(51) Int. Cl.
*H01L 21/311* (2006.01)
*H01L 21/02* (2006.01)
*H01L 21/67* (2006.01)
*H01L 21/3213* (2006.01)

(52) U.S. Cl.
CPC .... *H01L 21/31116* (2013.01); *H01L 21/0228* (2013.01); *H01L 21/02205* (2013.01); *H01L 21/31138* (2013.01); *H01L 21/32137* (2013.01); *H01L 21/67069* (2013.01)

(58) Field of Classification Search
None
See application file for complete search history.

(56) References Cited

U.S. PATENT DOCUMENTS

2016/0163561 A1 * 6/2016 Hudson ............. H01J 37/32623 438/696
2018/0286707 A1 10/2018 Hudson et al.

* cited by examiner

*Primary Examiner* — Roberts P Culbert
(74) *Attorney, Agent, or Firm* — Xsensus LLP

(57) ABSTRACT

A technique enables etching of a film on a substrate with reduced etching on the surface of a side wall. An etching method includes forming a protective layer on a surface of a side wall defining a recess in a substrate. The protective layer contains sulfur atoms. The etching method further includes etching a film on the substrate to increase a depth of the recess after forming the protective layer.

14 Claims, 10 Drawing Sheets

ETCHING METHOD, SUBSTRATE PROCESSING APPARATUS, AND SUBSTRATE PROCESSING SYSTEM

CROSS-REFERENCE TO RELATED APPLICATION

This application claims priority to Japanese Patent Application No. 2019-236675 filed on Dec. 26, 2019, the entire disclosure of which is incorporated herein by reference.

BACKGROUND

Technical Field

Exemplary embodiments of the present disclosure relate to an etching method, a substrate processing apparatus, and a substrate processing system.

Description of the Background

Manufacturing electronic devices includes plasma etching of films on substrates. Plasma etching is used for, for example, silicon-containing films. Plasma etching of silicon-containing films uses process gases containing a fluorocarbon gas. Such plasma etching is described in Patent Literature 1.

CITATION LIST

Patent Literature

Patent Literature 1: U.S. Patent Application Publication No. 2018/0286707

BRIEF SUMMARY

The present disclosure is directed to a technique for etching of a film on a substrate with reduced etching on the surface of a side wall.

An etching method according to an exemplary embodiment includes forming a protective layer on a surface of aside wall defining a recess in a substrate. The protective layer contains sulfur atoms. The etching method further includes etching a film on the substrate to increase a depth of the recess after forming the protective layer.

The technique according to an exemplary embodiment enables etching of a film on a substrate with reduced etching on the surface of a side wall.

DETAILED DESCRIPTION

Figure 1:
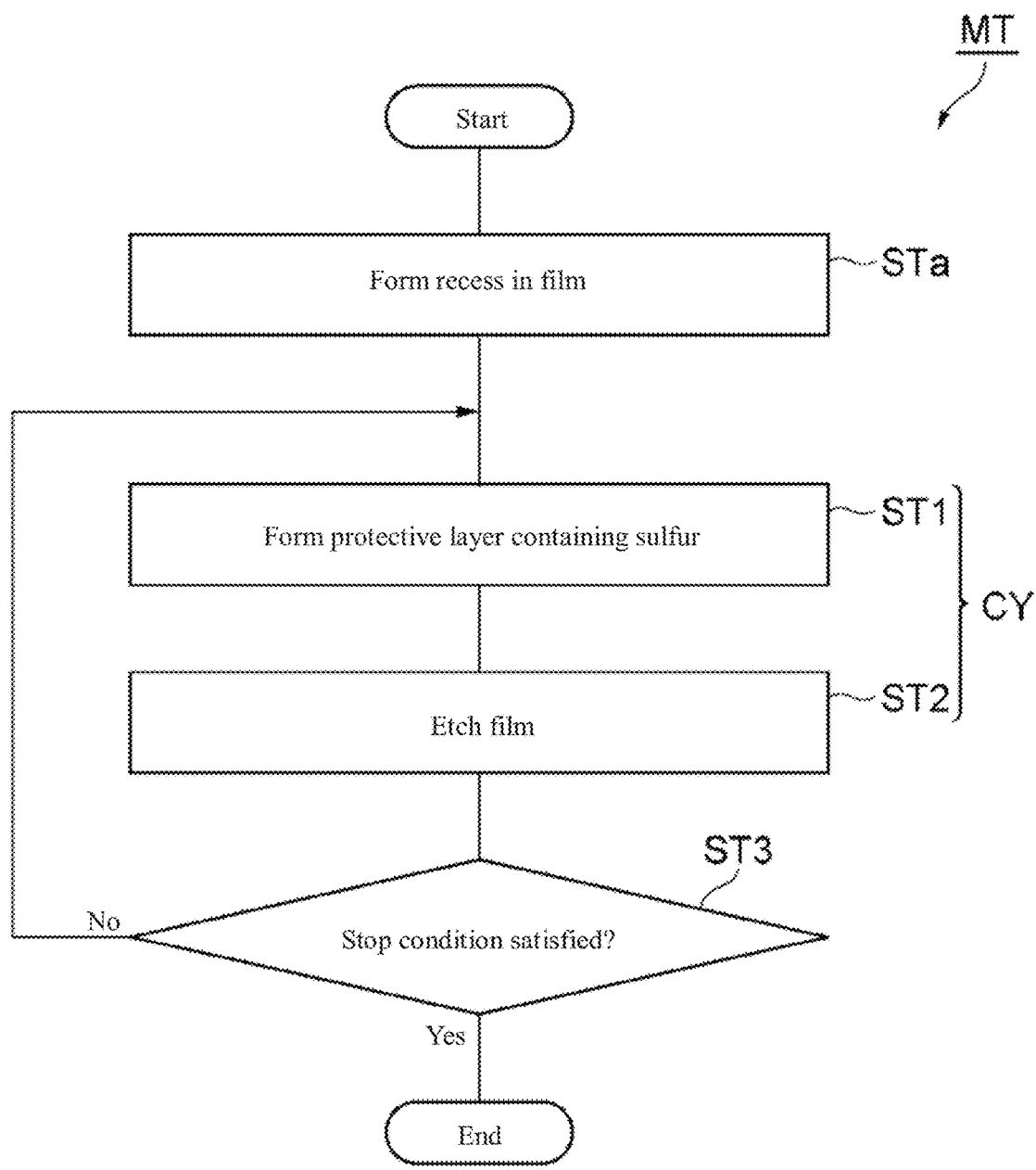
FIG. 1 is a flowchart of an etching method according to an exemplary embodiment.

Exemplary embodiments will now be described.

An etching method according to one exemplary embodiment includes forming a protective layer on a surface of a side wall defining a recess in a substrate. The protective layer contains sulfur atoms. The etching method further includes etching a film on the substrate to increase a depth of the recess after forming the protective layer.

In the above embodiment, the substrate has the side wall surface being protected by the protective layer when the film on the substrate is etched. The protective layer contains sulfur atoms and is highly resistant to a chemical species used for etching the film. The above embodiment thus enables etching of the film on the substrate W with reduced lateral etching of the side wall surface. The etching of the film may include plasma etching.

In one exemplary embodiment, the forming the protective layer may include forming a precursor layer on the surface of the side wall with a first gas, and forming the protective layer from the precursor layer with a second gas. In this embodiment, the first gas or the second gas may contain sulfur atoms.

In one exemplary embodiment, a plurality of film deposition cycles each including the forming the precursor layer and the forming the protective layer may be performed sequentially. In one exemplary embodiment, purging may be performed in an internal space of a chamber accommodating the substrate between the forming the precursor layer and the forming the protective layer, and between the forming the protective layer and the forming the precursor layer.

In one exemplary embodiment, the plurality of film deposition cycles may include at least one film deposition cycle in which the forming the precursor layer is performed under a condition different from a condition under which the forming the precursor layer is performed in at least another one of the plurality of film deposition cycles.

In one exemplary embodiment, the plurality of film deposition cycles may include at least one film deposition cycle in which the forming the protective layer from the precursor layer is performed under a condition different from a condition under which the forming the protective layer from the precursor layer is performed in at least another one of the plurality of film deposition cycles.

In one exemplary embodiment, the first gas may contain a sulfur-containing substance. The second gas may contain $H_2O$, an inorganic compound with an N—H bond, a carbon-containing substance, a silicon-containing substance, or a sulfur-containing substance.

In one exemplary embodiment, the first gas may contain a carbon-containing substance or a silicon-containing substance. The second gas may contain a sulfur-containing substance.

In one exemplary embodiment, the first gas may contain a sulfur-containing substance. The second gas may contain at least one of $H_2$, $O_2$, or $N_2$. The protective layer may be formed from the precursor layer receiving a chemical species in plasma generated from the second gas.

In one exemplary embodiment, the sulfur-containing substance contained in the first gas may include an isothiocyanate compound, a sulfonyl compound, a thiol compound, a thiophene compound, an episulfide compound, a disulfide compound, a sulfide compound, a thiocarbonyl compound, or a sulfide gas.

In one exemplary embodiment, the sulfur-containing substance contained in the second gas may include an isothiocyanate compound, a sulfonyl compound, a thiol compound, a thiophene compound, an episulfide compound, a disulfide compound, a sulfide compound, a thiocarbonyl compound, or a sulfide gas.

In one exemplary embodiment, the protective layer may be formed by chemical vapor deposition with a film deposition gas containing a sulfur-containing substance.

In one exemplary embodiment, the sulfur-containing substance in the film deposition gas may include an isothiocyanate compound, a sulfonyl compound, a thiol compound, a thiophene compound, an episulfide compound, a disulfide compound, a sulfide compound, a thiocarbonyl compound, or a sulfide gas.

In one exemplary embodiment, the film deposition gas may further contain a carbon-containing substance, a silicon-containing substance, $H_2$, $O_2$, $H_2O$, $N_2$, an inorganic compound with an N—H bond, or a noble gas.

In one exemplary embodiment, a plurality of cycles each including the forming the protective layer and the etching the film may be performed sequentially.

In one exemplary embodiment, the plurality of cycles may include at least one cycle in which the forming the protective layer is performed under a condition different from a condition under which the forming the protective layer is performed in at least another one of the plurality of cycles.

In one exemplary embodiment, the plurality of cycles may include at least one cycle in which the etching the film is performed under a condition different from a condition under which the etching the film is performed in at least another one of the plurality of cycles.

In one exemplary embodiment, the film may include a silicon-containing film or an organic film.

A substrate processing apparatus according to another exemplary embodiment includes a chamber, a substrate support, a gas supply unit, and a controller. The substrate support supports a substrate in the chamber. The gas supply unit supplies a gas into the chamber. The controller controls the gas supply unit. The controller controls the gas supply unit to supply one or more gases into the chamber to form a protective layer containing sulfur atoms on a surface of a side wall defining a recess in the substrate supported on the substrate support. The controller controls the gas supply unit to supply a process gas to etch a film on the substrate to increase a depth of the recess after the protective layer is formed.

A substrate processing system according to still another exemplary embodiment includes a film deposition apparatus and a substrate processing apparatus. The film deposition apparatus forms a protective layer containing sulfur atoms on a surface of a side wall defining a recess in a substrate. The substrate processing apparatus etches a film on the substrate to increase a depth of the recess after the protective layer is formed.

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

Figure 2:
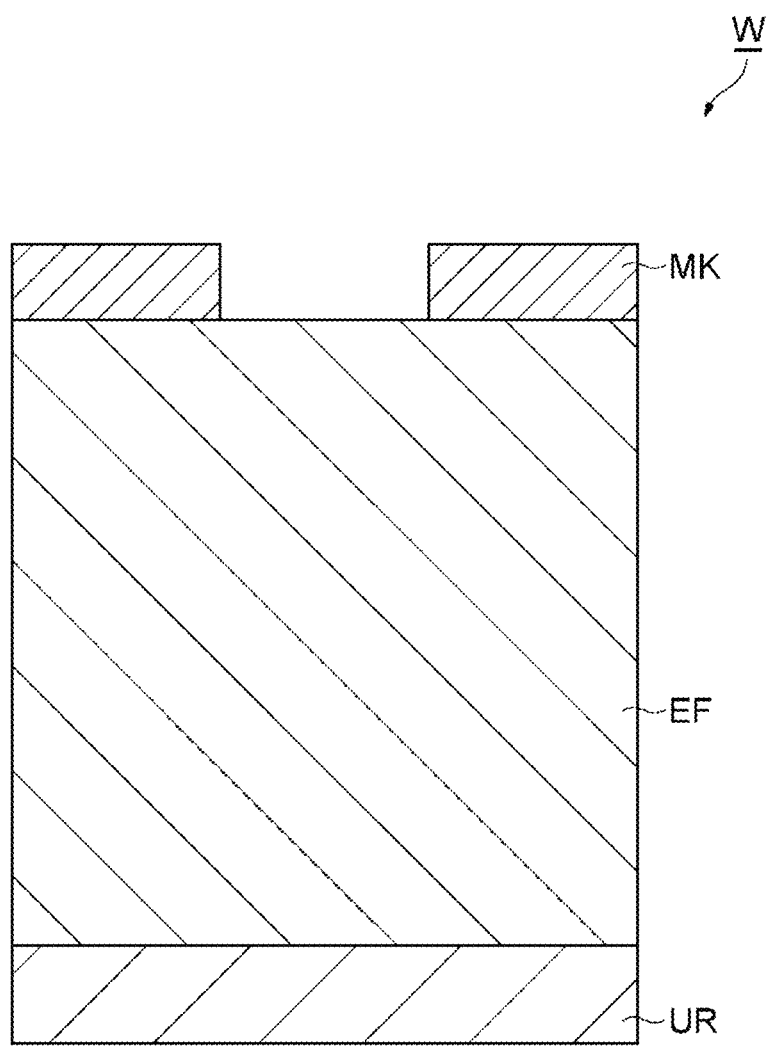
FIG. 2 is a partially enlarged cross-sectional view of an exemplary substrate.

FIG. 1 is a flowchart of an etching method according to an exemplary embodiment. The etching method shown in FIG. 1 (hereinafter referred to as a method MT) is used to etch a film on a substrate. FIG. 2 is a partially enlarged cross-sectional view of an exemplary substrate. A substrate W shown in FIG. 2 includes a film EF. The substrate W may further include an underlying region UR and a mask MK.

The film EF is on the underlying region UR. The mask MK is on the film EF. The mask MK is patterned, or in other words, the mask MK has one or more openings. The substrate W has side wall surfaces and bottom surfaces defining one or more recesses corresponding to the openings. The substrate W shown in FIG. 2 includes the mask MK defining the side wall surfaces and the film EF defining the bottom surfaces. The film EF is partially exposed through the openings in the mask MK. The film EF may be formed from any material, and may be a silicon-containing film or an organic film. The film EF may also be formed from a dielectric. The mask MK may be formed from any material for selective etching of the film EF with respect to the mask MK in step ST2 (described later).

A first exemplary substrate W includes an organic film as the film EF. The first exemplary substrate W includes the mask MK formed from a silicon-containing film. The silicon-containing film is, for example, an antireflective film containing silicon.

A second exemplary substrate W includes, as the film EF, a low-dielectric-constant film containing silicon, carbon, oxygen, and hydrogen, or in other words, a SiCOH film. The second exemplary substrate W includes the mask MK formed from a metal-containing film, such as a tungsten-containing film or a titanium-containing film. The mask MK in the second exemplary substrate W may be formed from a silicon nitride film, a polysilicon film, or an organic film such as a photoresist film.

A third exemplary substrate W includes a polycrystalline silicon film as the film EF. The third exemplary substrate W includes the mask MK formed from a metal-containing film, such as a tungsten-containing film or a titanium-containing film. The mask MK in the third exemplary substrate W may be formed from a silicon oxide film, a silicon nitride film, or an organic film such as a photoresist film.

A fourth exemplary substrate W includes a silicon-containing film as the film EF. The silicon-containing film may be a silicon-containing dielectric film. The silicon-containing film may be a single layer. The silicon-containing film may be a multilayer including at least one silicon-containing dielectric film. The silicon-containing film is, for example, a multilayer including silicon oxide films, silicon nitride films, or an alternate stack of silicon oxide films and silicon nitride films, or a multilayer including an alternate stack of silicon oxide films and polycrystalline silicon films. The fourth exemplary substrate W includes the mask MK formed from an organic film, a metal-containing film, or a polysilicon film. The organic film is, for example, an amorphous carbon film, a spin-on-carbon film, or a photoresist film. The metal-containing film is formed from, for example, tungsten or tungsten carbide.

Figure 3:
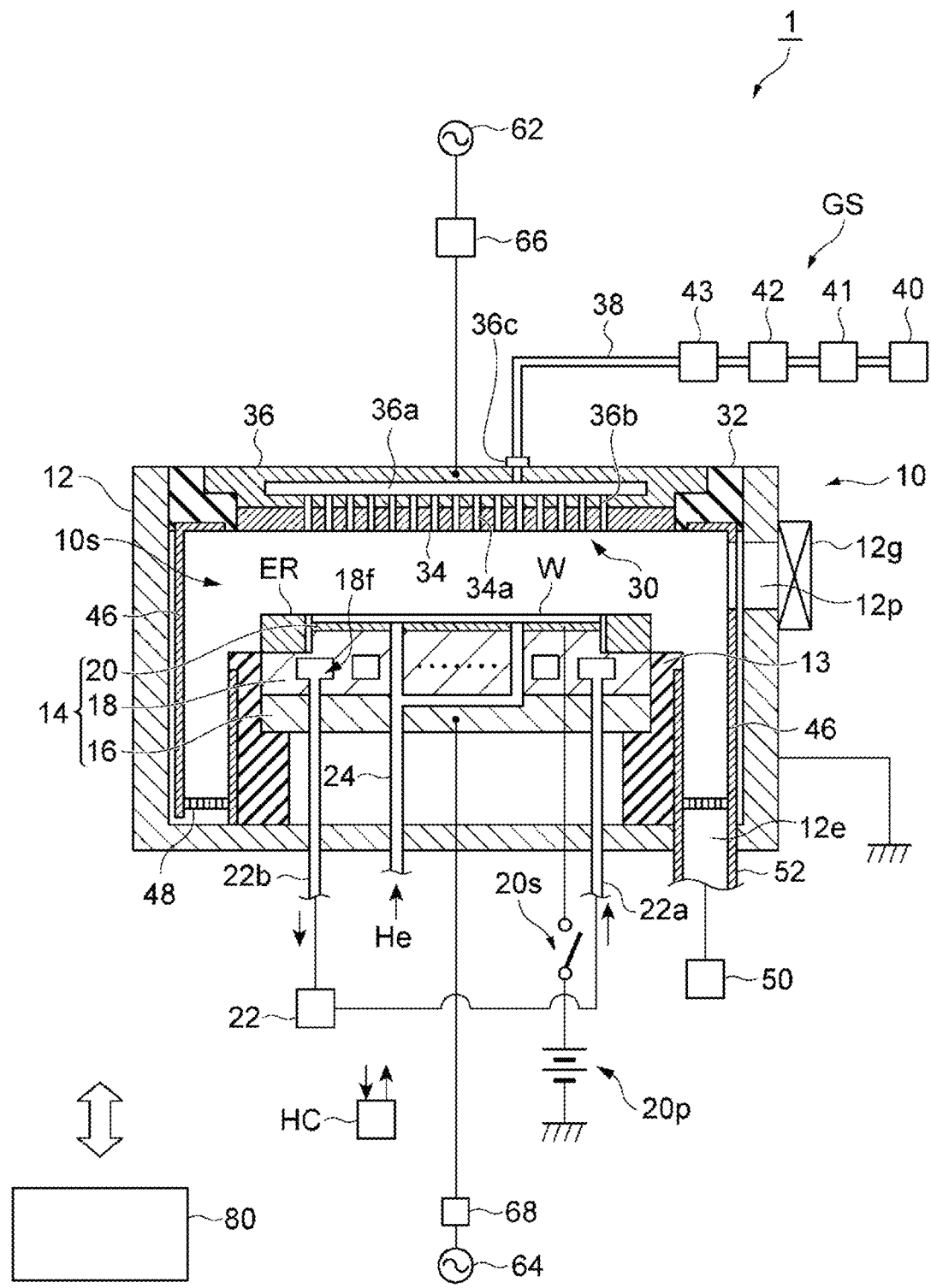
FIG. 3 is a schematic diagram of a substrate processing apparatus according to an exemplary embodiment.

In one embodiment, the method MT is implemented by a plasma processing apparatus. FIG. 3 is a schematic diagram of a substrate processing apparatus according to an exemplary embodiment. The plasma processing apparatus shown in FIG. 3 is a capacitively coupled plasma processing apparatus 1.

The plasma processing apparatus 1 includes a chamber 10 with an internal space 10s. The chamber 10 includes a chamber body 12, which is substantially cylindrical. The chamber body 12 has the internal space 10s and is formed from, for example, aluminum. The chamber body 12 has an inner wall coated with an anticorrosive film, which may be formed from ceramic such as aluminum oxide or yttrium oxide.

The chamber body 12 has a side wall having a port 12p. The substrate W is transferred between the internal space 10s and the outside of the chamber 10 through the port 12p. The port 2p can be open and closed by a gate valve 12g on the side wall of the chamber body 12.

A support 13 is on the bottom of the chamber body 12. The support 13 is substantially cylindrical and is formed from an insulating material. The support 13 extends upward from the bottom of the chamber body 12 into the internal space 10s. The support 13 supports a substrate support 14. The substrate support 14 supports the substrate W in the chamber 10, or more specifically, in the internal space 10s.

The substrate support 14 includes a lower electrode 18 and an electrostatic chuck (ESC) 20. The lower electrode 18 and the ESC 20 are accommodated in the chamber 10. The substrate support 14 may further include an electrode plate 16 accommodated in the chamber 10. The electrode plate 16 is substantially disk-shaped and is formed from a conductive material such as aluminum. The lower electrode 18 is on the electrode plate 16. The lower electrode 18 is substantially disk-shaped and is formed from a conductive material such as aluminum. The lower electrode 18 is electrically coupled to the electrode plate 16.

Figure 4:
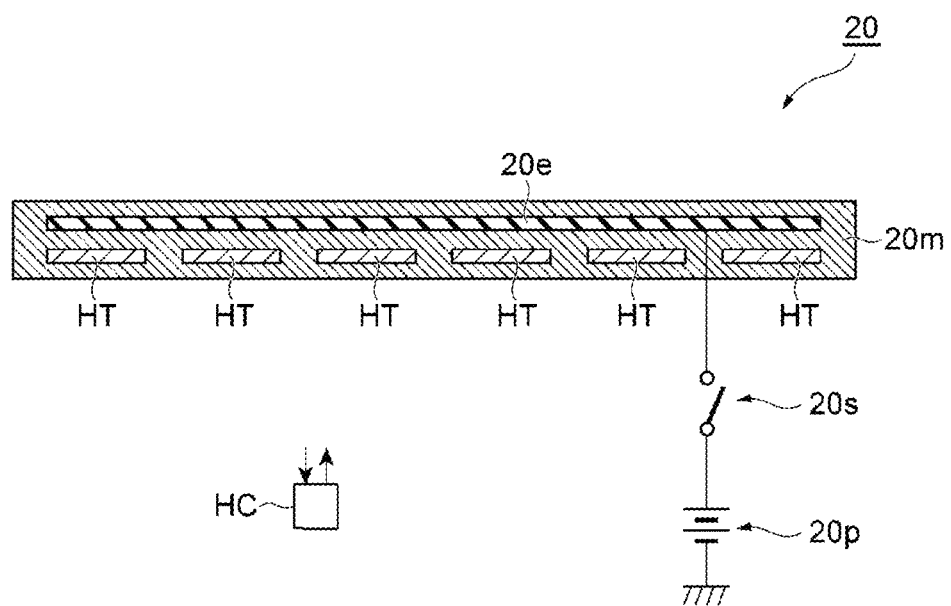
FIG. 4 is an enlarged cross-sectional view of an electrostatic chuck included in the substrate processing apparatus according to the exemplary embodiment.

FIG. 4 is an enlarged cross-sectional view of the ESC included in the substrate processing apparatus according to the exemplary embodiment. Referring now to FIGS. 3 and 4, the ESC 20 is on the lower electrode 18. The substrate W is placed onto an upper surface of the ESC 20. The ESC 20 includes a body 20m and an electrode 20e. The body 20m is substantially disk-shaped and is formed from a dielectric. The electrode 20e is a film electrode located in the body 20m. The electrode 20e is coupled to a direct-current (DC) power supply 20p via a switch 20s. A voltage applied from the DC power supply 20p to the electrode 20e generates an electrostatic attraction between the ESC 20 and the substrate W. The electrostatic attraction causes the ESC 20 to attract and hold the substrate W.

The substrate support 14 may include one or more heaters HT. The heaters HT may include resistance heating elements. The plasma processing apparatus 1 may further include a heater controller HC. The heaters HT each generate heat in accordance with power individually provided from the heater controller HC and thus adjust the temperature of the substrate W on the substrate support 14. The heaters HT each serve as a temperature adjuster in the plasma processing apparatus 1. In one embodiment, the substrate support 14 includes multiple heaters HT. The multiple heaters HT are accommodated in the ESC 20.

An edge ring ER is placed on the periphery of the substrate support 14 to surround an edge of the substrate W. The substrate W is placed in an area on the ESC 20 surrounded by the edge ring ER. The edge ring ER is used for more uniform processing across the surface of the substrate W with plasma. The edge ring ER may be formed from, but not limited to, silicon, silicon carbide, or quartz.

The lower electrode 18 has an internal channel 18f for carrying a heat-exchange medium (e.g., refrigerant) being supplied through a pipe 22a from a chiller unit 22 external to the chamber 10. The heat-exchange medium being supplied to the channel 18f returns to the chiller unit 22 through a pipe 22b. In the plasma processing apparatus 1, the temperature of the substrate W on the ESC 20 is adjusted through heat exchange between the heat-exchange medium and the lower electrode 18. The chiller unit 22 may also serve as the temperature adjuster in the plasma processing apparatus 1.

The plasma processing apparatus 1 includes a gas supply line 24. The gas supply line 24 supplies a heat-transfer gas (e.g., He gas) from a heat-transfer gas supply assembly into a space between the upper surface of the ESC 20 and a back surface of the substrate W.

The plasma processing apparatus 1 further includes an upper electrode 30 above the substrate support 14. The upper electrode 30 is supported on an upper portion of the chamber body 12 with a member 32 formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space 10s. The ceiling plate 34 may be formed from a low resistance conductor or a semiconductor with less Joule heat. The ceiling plate 34 has multiple gas outlet holes 34a that are through-holes in the thickness direction.

The support member 36 supports the ceiling plate 34 in a detachable manner. The support member 36 is formed from a conductive material such as aluminum. The support member 36 has an internal gas-diffusion compartment 36a. The support member 36 has multiple gas holes 36b that extend downward from the gas-diffusion compartment 36a. The gas holes 36b communicate with the respective gas outlet holes 34a. The support member 36 has a gas inlet 36c that connects to the gas-diffusion compartment 36a and to a gas supply pipe 38.

The gas supply pipe 38 is connected to a set of gas sources 40 via a set of valves 41, a set of flow controllers 42, and a set of valves 43. The gas source set 40, the valve set 41, the flow controller set 42, and the valve set 43 form a gas supply unit GS. The gas source set 40 includes multiple gas sources that are used with the method MT. When one or more gases used with the method MT are formed from a liquid, the gas sources include one or more gas sources each including a liquid source and a vaporizer. The valve sets 41 and 43 each include multiple open-close valves. The flow controller set 42 includes multiple flow controllers. The flow controllers in the flow controller set 42 are mass flow controllers or pressure-based flow controllers. The gas sources in the gas source set 40 are connected to the gas supply pipe 38 via the respective open-close valves in the valve set 41, via the respective flow controllers in the flow controller set 42, and via the respective open-close valves in the valve set 43.

The plasma processing apparatus 1 may further include a shield 46 along the inner wall of the chamber body 12 in a detachable manner. The shield 46 also extends along the periphery of the support 13. The shield 46 prevents an etching product from accumulating on the chamber body 12. The shield 46 includes, for example, an aluminum member coated with an anticorrosive film, which may be formed from ceramic such as yttrium oxide.

A baffle plate 48 is located between the support 13 and the side wall of the chamber body 12. The baffle plate 48 includes, for example, an aluminum member coated with an anticorrosive film, which may be formed from ceramic such as yttrium oxide. The baffle plate 48 has multiple through-holes. The chamber body 12 has an outlet 12e in its bottom below the baffle plate 48. The outlet 12e is connected to an exhaust device 50 through an exhaust pipe 52. The exhaust device 50 includes a pressure control valve and a vacuum pump such as a turbomolecular pump.

The plasma processing apparatus 1 further includes a first radio-frequency (RF) power supply 62 and a second RF power supply 64. The first RF power supply 62 generates first RF power having a frequency suitable for generating plasma. The first RF power has a frequency ranging from, for example, 27 to 100 MHz. The first RF power supply 62 is coupled to the upper electrode 30 via an impedance matching circuit, or matcher 66, and the electrode plate 16. The matcher 66 includes a circuit for matching the output impedance of the first RF power supply 62 and the impedance of a load (the upper electrode 30). The first RF power supply 62 may be coupled to the lower electrode 18 via the matcher 66. The first RF power supply 62 serves as an exemplary plasma generator.

The second RF power supply 64 generates second RF power having a lower frequency than the first RF power. The second RF power, when used in addition to the first RF power, serves as bias RF power for drawing ions toward the substrate W. The second RF power has a frequency ranging from, for example, 400 kHz to 13.56 MHz. The second RF power supply 64 is coupled to the lower electrode 18 via an impedance matching circuit, or matcher 68, and the electrode plate 16. The matcher 68 includes a circuit for matching the output impedance of the second RF power supply 64 and the impedance of a load (the lower electrode 18).

The second RF power alone may be used to generate plasma, without the first RF power being used. In other words, a single RF power may be used to generate plasma. In this case, the second RF power may have a frequency higher than 13.56 MHz, or for example, 40 MHz. In this case, the plasma processing apparatus 1 may not include the first RF power supply 62 and the matcher 66. In this case, the second RF power supply 64 serves as an exemplary plasma generator.

The gas supply unit GS supplies a gas into the internal space 10s to generate plasma in the plasma processing apparatus 1. At least one of the first RF power or the second RF power is provided to form, between the upper electrode 30 and the lower electrode 18, an RF electric field that excites the gas to generate plasma.

The plasma processing apparatus 1 may further include a controller 80. The controller 80 may be a computer including a processor, a storage such as a memory, an input device, a display, and an input-output interface for signals. The controller 80 controls the components of the plasma processing apparatus 1. An operator can use the input device in the controller 80 to input a command or perform other operations for managing the plasma processing apparatus 1. The display in the controller 80 can display and visualize the operating state of the plasma processing apparatus 1. The storage in the controller 80 stores control programs and recipe data. The control program is executed by the processor in the controller 80 to perform the processing in the plasma processing apparatus 1. The processor in the controller 80 executes the control program to control the components of the plasma processing apparatus 1 in accordance with the recipe data, allowing the method MT to be implemented by the plasma processing apparatus 1.

Referring back to FIG. 1, the method MT will now be described in detail. The method MT used by the plasma processing apparatus 1 to process the substrate W shown in FIG. 2 will be described by way of example. The method MT may be used by another substrate processing apparatus. The method MT may be used to process another substrate.

The method MT is implemented with the substrate W placed on the substrate support 14. The method MT may be implemented while the internal space 10s of the chamber 10 is being decompressed without the substrate W being unloaded from the internal space 10s. In one embodiment, the method MT may start from step STa. In step STa, the film EF is etched with plasma.

In step STa, plasma Pa is generated from a process gas in the chamber 10. To process the first exemplary substrate W described above including an organic film serving as the film EF on the substrate W, a process gas containing an oxygen-containing gas may be used in step STa. The oxygen-containing gas includes, for example, an oxygen gas, a carbon monoxide gas, or a carbon dioxide gas. In some embodiments, the process gas used in step STa to process the first exemplary substrate W may contain at least one of a nitrogen gas or a hydrogen gas.

To process the second exemplary substrate W described above including a low-dielectric-constant film serving as the film EF on the substrate W, a process gas containing a fluorine-containing gas may be used in step STa. The fluorine-containing gas includes a fluorocarbon gas. The fluorocarbon gas includes a $C_4F_8$ gas.

To process the third exemplary substrate W described above including a polycrystalline silicon film serving as the film EF on the substrate W, a process gas containing a halogen-containing gas may be used in step STa. The halogen-containing gas includes a HBr gas, a $Cl_2$ gas, or a $SF_6$ gas.

To process the fourth exemplary substrate W described above including a silicon oxide film serving as the film EF, a process gas containing a fluorocarbon gas may be used in step STa. To process the fourth exemplary substrate W including a silicon nitride film serving as the film EF, a process gas containing a hydrofluorocarbon gas may be used in step STa. To process the fourth exemplary substrate W including a multilayer including an alternate stack of silicon oxide films and silicon nitride films serving as the film EF a process gas containing a fluorocarbon gas and a hydrofluorocarbon gas may be used in step STa. To process the fourth exemplary substrate W including an alternate stack of silicon oxide films and polysilicon films serving as the film EF, a process gas containing a fluorocarbon gas and a halogen-containing gas may be used in step STa. The fluorocarbon gas includes a $CF_4$ gas, a $C_4F_6$ gas, or a $C_4F$ gas. The hydrofluorocarbon gas includes a $CH_3F$ gas. The halogen-containing gas includes a HBr gas or a $Cl_2$ gas.

Figure 5A:
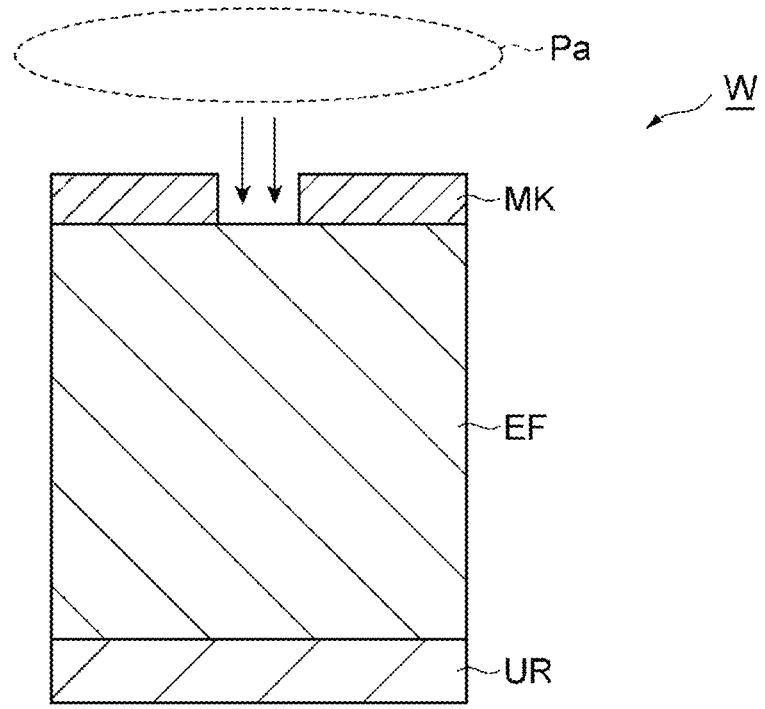
FIG. 5A is a diagram illustrating an exemplary step STa included in the etching method shown in FIG. 1.
Figure 5B:
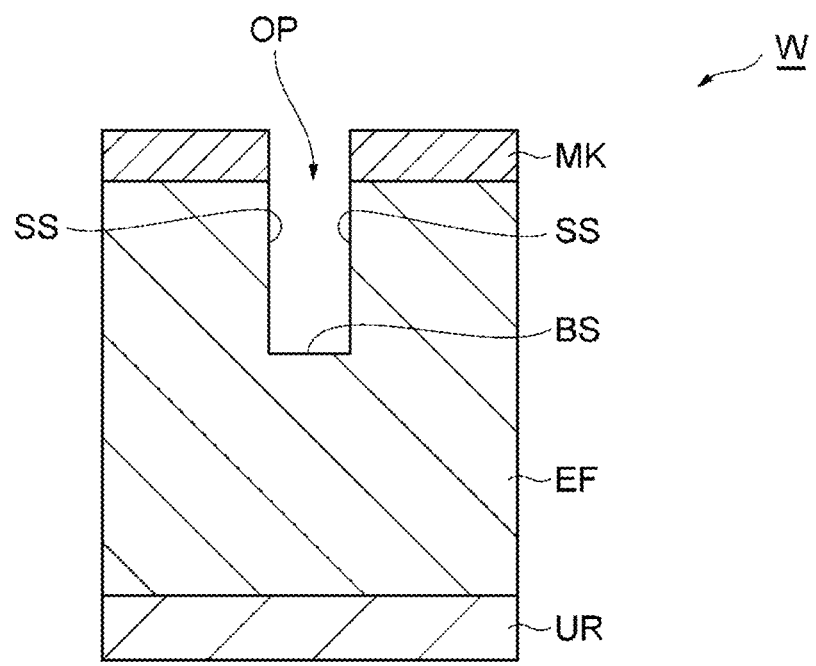
FIG. 5B is a partially enlarged cross-sectional view of the exemplary substrate after step STa.

FIG. 5A is a diagram illustrating an exemplary step STa included in the etching method shown in FIG. 1. FIG. 5B is a partially enlarged cross-sectional view of an exemplary substrate after step STa. In step STa, the film EF is exposed to a chemical species in the plasma Pa to be etched as shown in FIG. 5A. In step STa, the film EF is etched to a position between its lower and upper surfaces. The position is defined to allow etching of the film EF to the position in step STa without causing substantially any lateral etching of the film EF. The lower surface of the film EF is an interface in contact with the underlying region UR. The upper surface of the film EF is exposed through an opening in the mask MK. When step STa is performed, a recess OP, which is continuous with the opening in the mask MK, is formed in the film EF as shown in FIG. 5B. The recess OP is defined by a side wall surface SS and a bottom surface BS. The mask MK and the film EF include the side wall surface SS. The film EF includes the bottom surface BS. The mask MK can be thinner after step STa.

In step STa, the controller 80 controls the exhaust device 50 to maintain the chamber 10 at a specified gas pressure. In step STa, the controller 80 controls the gas supply unit GS to supply the process gas into the chamber 10. In step STa, the controller 80 controls the plasma generator to generate plasma from the process gas. In step STa in one embodiment, the controller 80 controls at least one of the first RF power supply 62 or the second RF power supply 64 to provide at least one of the first RF power or the second RF power.

The method MT may eliminate step STa. In this case, the film EF on the substrate to be processed with the method MT has the recess OP in advance. With the method MT with no step STa, the processing in steps ST1 and ST2 may be performed on the substrate W shown in FIG. 2.

Figure 6:
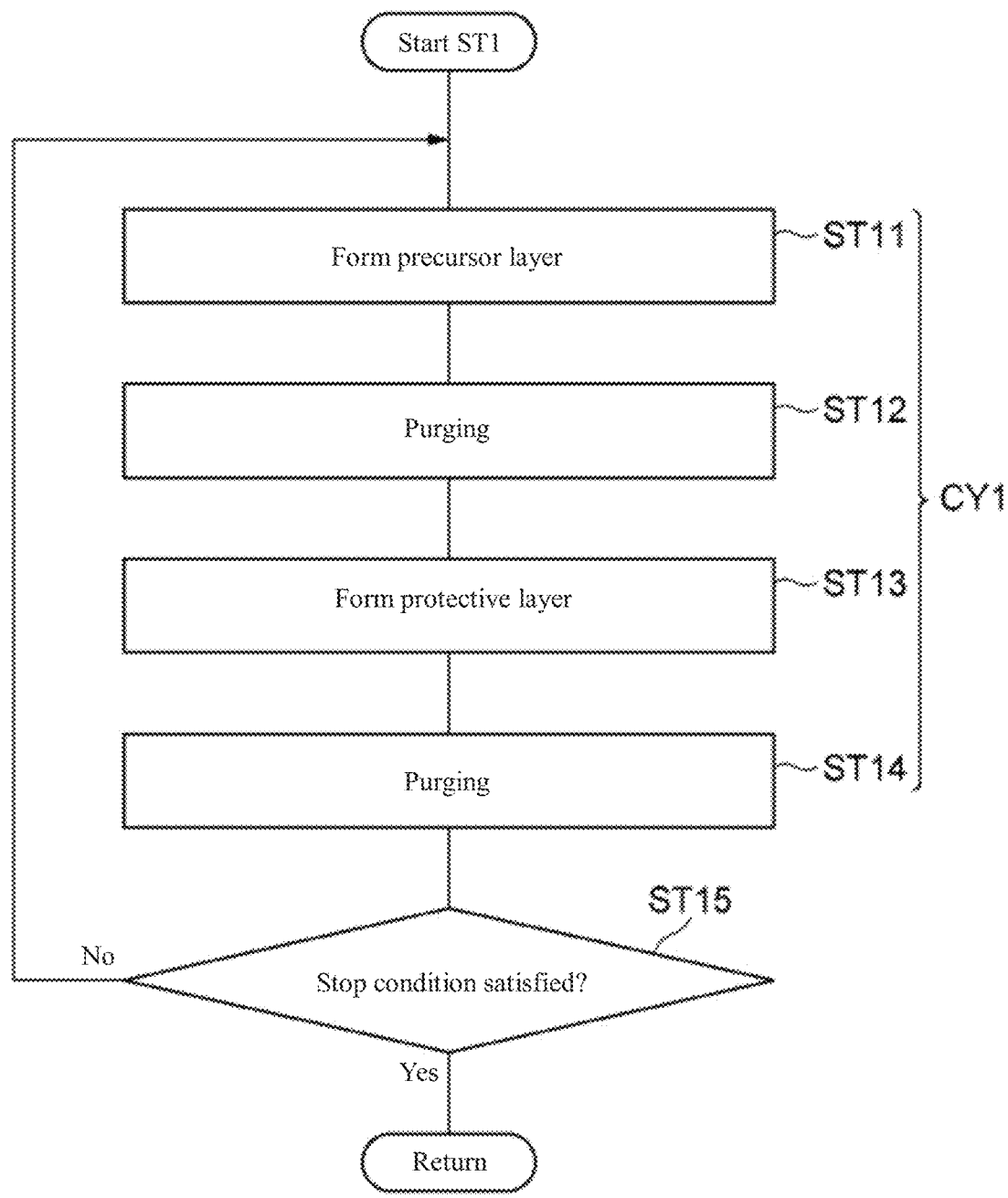
FIG. 6 is a flowchart of film deposition that may be included in the etching method according to the exemplary embodiment.
Figure 7A:
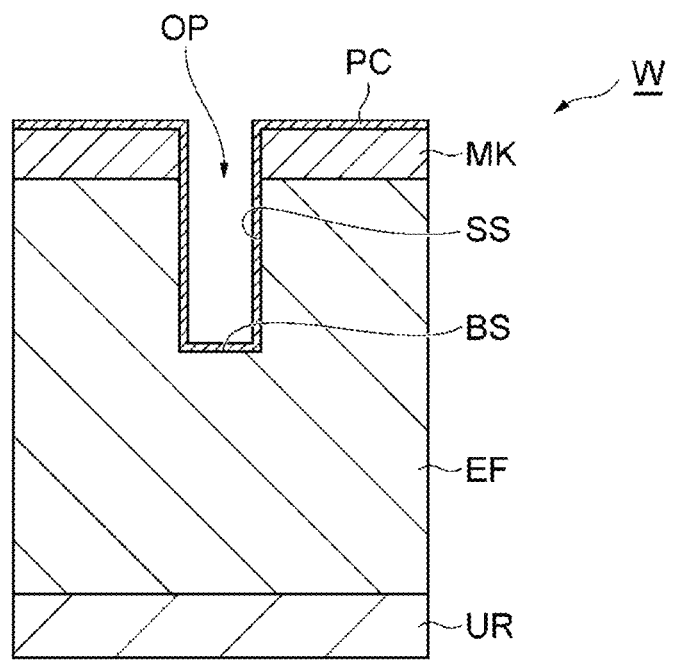
FIG. 7A is a partially enlarged cross-sectional view of the exemplary substrate after a precursor layer is formed.
Figure 7B:
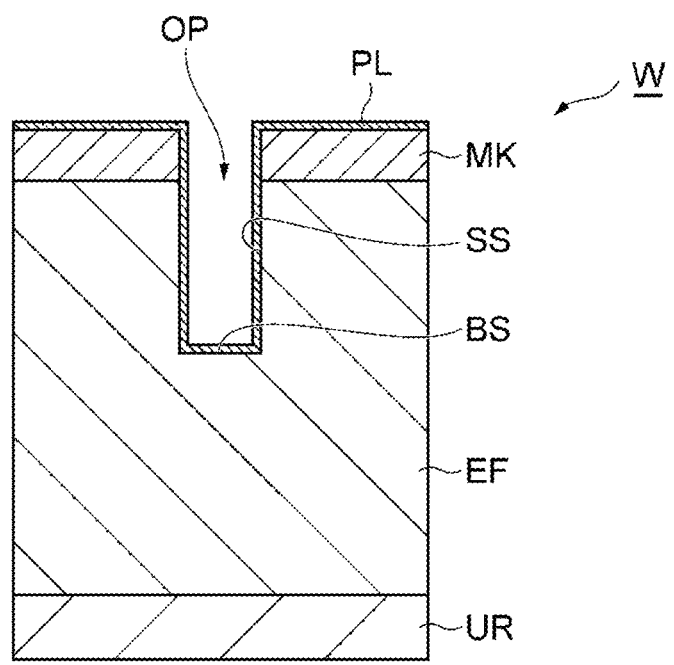
FIG. 7B is a partially enlarged cross-sectional view of the exemplary substrate after a protective layer is formed.

In step ST1, a protective layer PL is formed on the side wall surface SS defining the recess OP in the substrate W. The protective layer PL contains sulfur atoms. In one embodiment, step ST1 may include film deposition shown in a flowchart of FIG. 6. FIG. 6 is a flowchart of film deposition included in the etching method according to an exemplary embodiment. FIGS. 7A and 7B will now be referred to in addition to FIG. 6. FIG. 7A is a partially enlarged cross-sectional view of the exemplary substrate after a precursor layer is formed. FIG. 7B is a partially enlarged cross-sectional view of the exemplary substrate after a protective layer is formed.

In one embodiment, step ST1 includes step ST11 and step ST13. Step ST1 may further include step ST12 and step ST14. Step ST12 is performed between step ST11 and step ST13. Step ST14 is performed between step ST13 and step ST1.

In step ST11, a precursor layer PC is formed on the surface of the substrate W including the side wall surface SS. In step ST11, the precursor layer PC is formed with a first gas. The first gas contains a substance for forming the precursor layer PC on the substrate W. The first gas or a second gas used in step ST13 contains sulfur atoms. The first gas may further contain a carrier gas, which is an inert gas such as a noble gas or a nitrogen gas. In step ST11, the precursor layer PC is formed on the substrate W with the substance contained in the first gas as shown in FIG. 7A. In step ST11, the precursor layer PC may be formed without involving plasma generation from the first gas. In some embodiments, the precursor layer PC may be formed with a chemical species in the plasma generated from the first gas in step ST11.

In step ST11, the controller 80 controls the gas supply unit GS to supply the first gas into the chamber 10. In step ST11, the controller 80 controls the exhaust device 50 to maintain the chamber 10 at a specified gas pressure. When step ST11 involves plasma generation, the controller 80 controls the plasma generator to generate plasma from the first gas in the chamber 10. In one embodiment, the controller 80 controls at least one of the first RF power supply 62 or the second RF power supply 64 to provide at least one of the first RF power or the second RF power to generate plasma from the first gas.

In step ST12, the gas in the internal space 10s is purged. In step ST12, the controller 80 controls the exhaust device 50 to evacuate the internal space 10s. In step ST12, the controller 80 may control the gas supply unit GS to supply an inert gas into the chamber 10. The processing in step ST12 may replace the first gas with the inert gas in the chamber 10. The processing in step ST12 may remove excessive substances adsorbed on the substrate W. The processing in steps ST11 and ST12 may forma monomolecular precursor layer PC on the substrate W.

In step ST13, the protective layer PL is formed from the precursor layer PC as shown in FIG. 7B. In step ST13, the second gas is used to form the protective layer PL. The second gas contains a reactive species that reacts with a substance contained in the precursor layer PC to form the protective layer PL from the precursor layer PC. The second gas may further contain a carrier gas. The carrier gas is an inert gas such as a noble gas or a nitrogen gas. In step ST13, the protective layer PL may be formed without involving plasma generation from the second gas. In some embodiments, the protective layer PL may be formed with a chemical species in the plasma generated from the second gas in step ST13.

In step ST13, the controller 80 controls the gas supply unit GS to supply the second gas into the chamber 10. In step ST13, the controller 80 controls the exhaust device 50 to maintain the chamber 10 at a specified gas pressure. When step ST13 involves plasma generation, the controller 80 controls the plasma generator to generate plasma from the second gas in the chamber 10. In one embodiment, the controller 80 controls at least one of the first RF power supply 62 or the second RF power supply 64 to provide at least one of the first RF power or the second RF power to generate plasma from the second gas.

In step ST14, the gas in the internal space 10s is purged. The processing in step ST14 is the same as the processing in step ST12. The processing in step ST14 may replace the second gas with the inert gas in the chamber 10.

In step ST1, multiple film deposition cycles CY1 each including steps ST11 and ST13 may be repeated sequentially. The film deposition cycles CY1 each may further include steps ST12 and ST14. The thickness of the protective layer PL may be adjusted by controlling the number of film deposition cycles CY1 to be repeated. When the film deposition cycle CY1 is repeated, the determination is performed as to whether a stop condition is satisfied in step ST15. The stop condition is satisfied when the count of film deposition cycles CY1 performed reaches a predetermined number. When the stop condition is not satisfied in step ST15, the film deposition cycle CY1 is restarted. When the stop condition is satisfied in step ST15, step ST1 ends and the processing advances to step ST2 as shown in FIG. 1.

In one embodiment, the first gas contains a sulfur-containing substance and the second gas contains $H_2O$, an inorganic compound with an N—H bond, a carbon-containing substance, a silicon-containing substance, or a sulfur-containing substance. The sulfur-containing substance contained in the first gas and the sulfur-containing substance that may be contained in the second gas may be an isothiocyanate compound, a sulfonyl compound, a thiol compound, a thiophene compound, an episulfide compound, a disulfide compound, a sulfide compound, a thiocarbonyl compound, or a sulfide gas. The isothiocyanate compound is, for example, phenyl isothiocyanate, isothiocyanatotrimethylsilane, tolylene diisothiocyanate, or 1,4-butane diisothiocyanate. The sulfonyl compound is, for example, benzenesulphonyl chloride, bis-trichloromethyl sulfone, or 1,3- benzenedisulfonyl fluoride. The thiol compound is, for example, methanethiol, allyl mercaptan, 1,2-ethanediol, or 1,3-benzenedithiol. The thiophene compound is, for example, thiophene, 2-thiophenecarboxylic acid, or 3-phenylthiophene. The episulfide compound is, for example, ethylene sulfide or propylene sulfide. The disulfide compound is, for example, diethyl disulfide or diphenyl disulfide. The sulfide compound is, for example, dimethyl sulfide or tetrahydrothiophene. The thiocarbonyl compound is, for example, di-tert-butyl thioketone, thioacrolein, or dithioacetic acid. The sulfide gas includes sulfur dioxide, carbon disulfide, carbonyl sulfide, or hydrogen sulfide. The inorganic compound with an N—H bond may be ammonia ($NH_3$), diazene ($N_2H_2$), hydrazine ($N_2H_4$), or an amine. The amine is, for example, dimethylamine or ethylenediamine. The carbon-containing substance may be a hydrocarbon, a fluorocarbon, an organic compound with a hydroxyl group, a carboxylic acid, a carboxylic anhydride, or a carboxylic halide. The hydrocarbon is, for example, an alkene compound such as methane or propylene. The fluorocarbon is, for example, $CF_4$ or $C_4F_6$. The organic compound with a hydroxyl group is, for example, alcohols such as methanol or ethylene glycol, or phenols. The carboxylic acid is, for example, acetic acid or oxalic acid. The silicon-containing substance is, for example, silicon chloride or aminosilane. The sulfur-containing substance contained in the first gas and the sulfur-containing substance that may be contained in the second gas may be the same or different from each other. When the first gas and the second gas contain the same sulfur-containing substance, plasma formed from either the first gas or the second gas is used.

In another embodiment, the first gas contains the above carbon-containing substance or the above silicon-containing substance, and the second gas contains the above sulfur-containing substance. In a still another embodiment, the first gas contains the above sulfur-containing substance and the second gas contains at least one of $H_2$, $O_2$, or $N_2$. In this embodiment, the protective layer PL is formed from the precursor layer PC receiving a chemical species in the plasma generated from the second gas.

Step ST2 follows step ST1 in which the protective layer PL is formed on the side wall surface SS. The method MT may further include, before step ST2, a step (breakthrough process) for generating plasma from for example, a $CF_4$ gas to etch the protective layer PL on the bottom surface BS. Step ST2 includes etching the film EF. In one embodiment, the film EF is etched with a chemical species in the plasma. In step ST2, plasma P2 is generated from a process gas in the chamber 10. To process the first exemplary substrate W described above including the organic film serving as the film EF on the substrate W, a process gas containing an oxygen-containing gas may be used in step ST2. The oxygen-containing gas includes, for example, an oxygen gas, a carbon monoxide gas, or a carbon dioxide gas. In some embodiments, the process gas used in step ST2 for processing the first exemplary substrate W may contain at least one of a nitrogen gas or a hydrogen gas.

To process the second exemplary substrate W described above including the low-dielectric-constant film serving as the film EF on the substrate W, a process gas containing a fluorine-containing gas may be used in step ST2. The fluorine-containing gas includes a fluorocarbon gas. The fluorocarbon gas includes a $C_4F_8$ gas.

To process the third exemplary substrate W described above including the polycrystalline silicon film serving as the film EF on the substrate W, a process gas containing a halogen-containing gas may be used in step ST2. The halogen-containing gas includes a HBr gas, a $Cl_2$ gas, or a $SF_6$ gas.

To process the fourth exemplary substrate W described above including the silicon oxide film serving as the film EF, a process gas containing a fluorocarbon gas may be used in step ST2. To process the fourth exemplary substrate W including the silicon nitride film serving as the film EF, a process gas containing a hydrofluorocarbon gas may be used in step ST2. To process the fourth exemplary substrate W including the multilayer including the alternate stack of silicon oxide films and silicon nitride films serving as the film EF, a process gas containing a fluorocarbon gas and a hydrofluorocarbon gas may be used in step ST2. To process the fourth exemplary substrate W including the multilayer including the alternate stack of silicon oxide films and polysilicon films serving as the film EF, a process gas containing a fluorocarbon gas and a halogen-containing gas may be used in step ST2. The fluorocarbon gas includes a $CF_4$ gas, a $C_4F_6$ gas, or a $C_4F_8$ gas. The hydrofluorocarbon gas includes a $CH_3F$ gas. The halogen-containing gas includes a HBr gas or a $Cl_2$ gas.

Figure 8A:
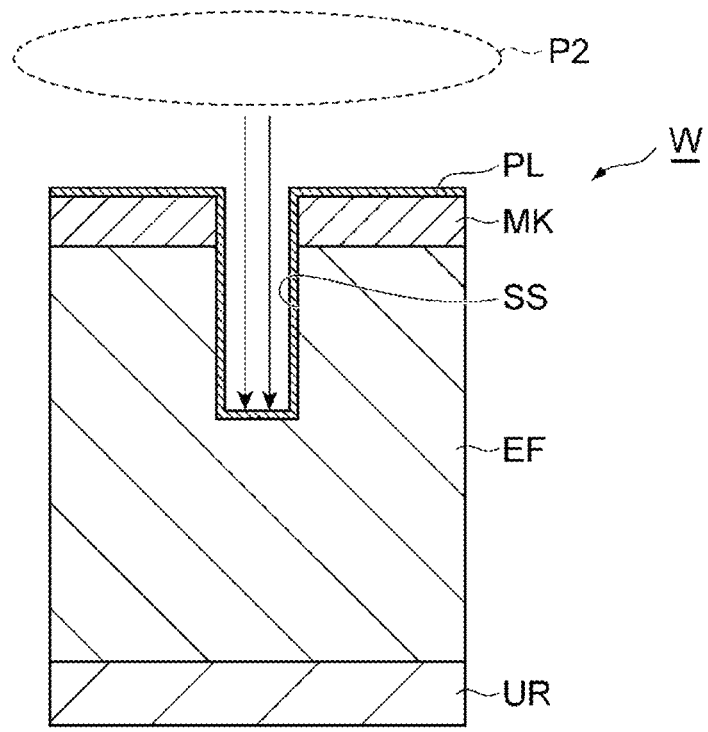
FIG. 8A is a diagram illustrating an example step ST2 included in the etching method shown in FIG. 1.
Figure 8B:
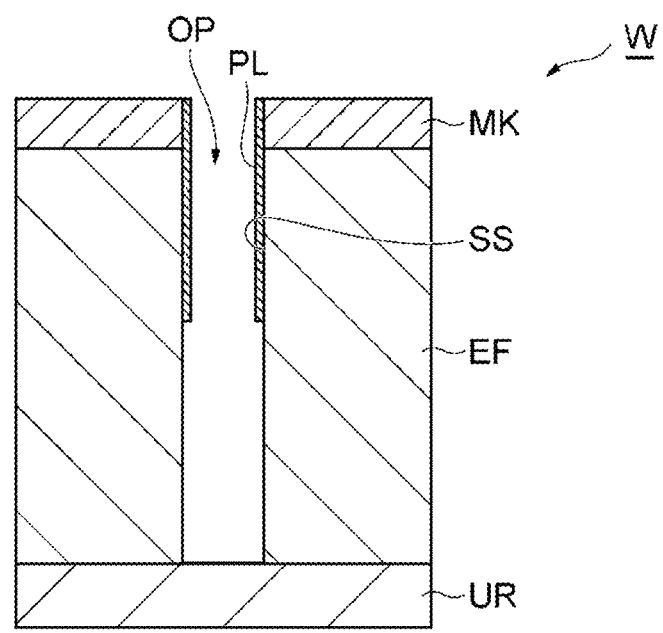
FIG. 8B is a partially enlarged cross-sectional view of the exemplary substrate after step ST2.

FIG. 8A is a diagram illustrating an example step ST2 included in the etching method shown in FIG. 1. FIG. 8B is a partially enlarged cross-sectional view of the exemplary substrate after step ST2. In step ST2, the film EF is exposed to a chemical species in the plasma P2 to be etched as shown in FIG. 8A. The processing in step ST2 increases the depth of the recess OP as shown in FIG. 8B.

In step ST2, the controller 80 controls the exhaust device 50 to maintain the chamber 10 at a specified gas pressure. In step ST2, the controller 80 controls the gas supply unit GS to supply the process gas into the chamber 10. In step ST2, the controller 80 controls the plasma generator to generate plasma from the process gas. In step ST2 in one embodiment, the controller 80 controls at least one of the first RF power supply 62 or the second RF power supply 64 to provide at least one of the first RF power or the second RF power.

With the method MT, multiple cycles CY each including steps ST1 and ST2 may be performed sequentially. When the cycles CY are performed sequentially, the determination is performed as to whether a stop condition is satisfied in step ST3. The stop condition is satisfied when the count of the cycles CY performed reaches a predetermined number. When the stop condition is not satisfied in step ST3, the cycle CY is restarted. When the stop condition is satisfied in step ST3, the method MT ends.

With the method MT, the substrate W has the side wall surface SS being protected by the protective layer PL when the film EF on the substrate W is etched. The protective layer PL contains sulfur atoms and is highly resistant to a chemical species used for etching the film EF. The method MT thus enables etching of the film EF on the substrate W with reduced lateral etching of the side wall surface SS.

The condition for step ST1 for forming the protective layer PL in at least one of the multiple cycles CY may differ from the condition for step ST1 for forming the protective layer PL in at least another one of the multiple cycles CY. The conditions for step ST1 may differ in each cycle CY. In this case, a protective layer PL is formed in each cycle to have a thickness or coverage different from the thickness or coverage of a protective layer PL formed in other cycles.

The condition for step ST2 for etching the film EF in at least one of the multiple cycles CY may differ from the condition for step ST2 for etching the film EF in at least another one of the multiple cycles CY. The conditions for step ST2 may differ in each cycle CY. In this case, the film EF etched in each cycle has an etched amount different from the etched amount of the film EF in other cycles.

In each of the multiple cycles CY, the condition for forming the protective layer PL in at least one film deposition cycle of the multiple film deposition cycles CY1 may differ from the condition for forming the protective layer PL in at least another one of the multiple film deposition cycles CY1. More specifically, in each of the multiple cycles CY, the condition for at least step ST11 or step ST13 in one film deposition cycle may differ from the condition for at least step ST11 or step ST13 in at least another film deposition cycle. In each of the multiple cycles CY, the conditions for forming the protective layer PL may differ in each of the film deposition cycles CY1. In this case, the thickness distributions of the protective layers PL formed in the multiple film deposition cycles CY1 included in the multiple cycles CY may be controlled.

Figure 9A:
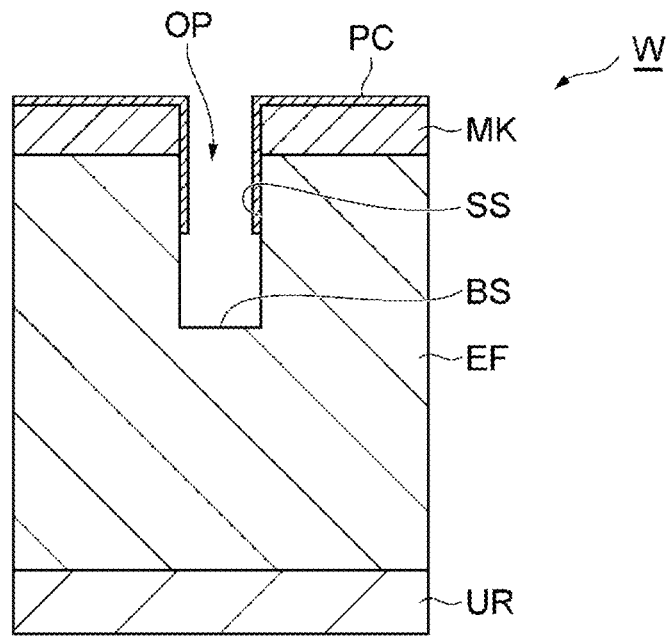
FIG. 9A is a partially enlarged cross-sectional view of an exemplary substrate after a precursor layer is formed.
Figure 9B:
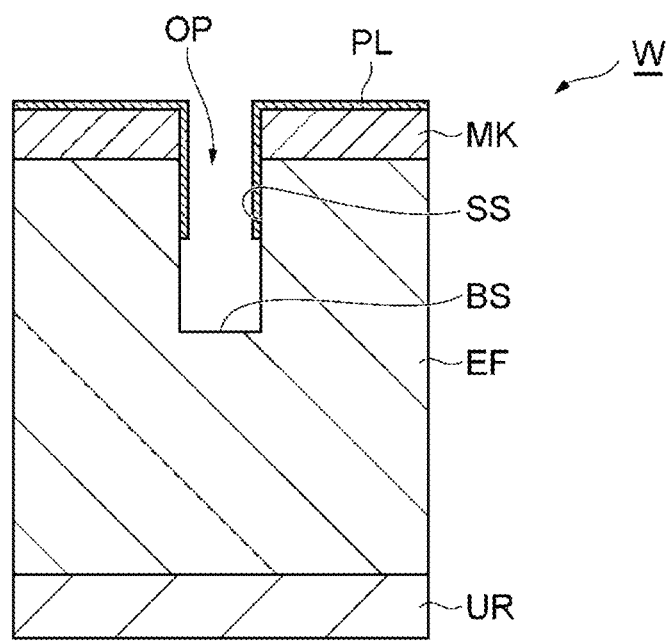
FIG. 9B is a partially enlarged cross-sectional view of the exemplary substrate after a protective layer is formed.

FIG. 9A is a partially enlarged cross-sectional view of an exemplary substrate after a precursor layer is formed. FIG. 9B is a partially enlarged cross-sectional view of the exemplary substrate after a protective layer is formed. As shown in FIG. 9B, the protective layer PL may cover a part of the side wall surface SS that can otherwise undergo lateral etching, rather than covering the entire surface of the substrate W. For example, the protective layer PL may not cover the bottom surface BS. In some embodiments, the protective layer PL may have the thickness distribution varying depending on position. For example, the protective layer PL may have a thickness larger at positions near the upper end of the recess OP and smaller or no thickness at positions near a deeper portion of the recess OP. The protective layer PL with such a thickness distribution may be formed through film deposition of the protective layer PL (described later with reference to FIGS. 9A and 9B) or through chemical vapor deposition (CVD).

To form the protective layer PL shown in FIG. 9B, the precursor layer PC may be formed in step ST11 to cover a part of the side wall surface SS, rather than the entire surface of the substrate W as shown in FIG. 9A. To form the precursor layer PC in this manner, at least one of the first to fifth conditions below is satisfied in step ST1. Under a first condition, the gas pressure in the chamber 10 is set to a lower pressure than the pressure at which the substance forming the precursor layer PC is adsorbed on the entire surface of the substrate W during step ST11 when the other processing conditions are the same. Under a second condition, the processing duration for step ST11 is set to a shorter duration than the processing duration for which the substance forming the precursor layer PC is adsorbed on the entire surface of the substrate W when the other processing conditions are the same. Under a third condition, the dilution ratio of the first gas containing the substance forming the precursor layer PC is set to a higher ratio than the dilution ratio at which the substance forming the precursor layer PC is adsorbed on the entire surface of the substrate W when the other processing conditions are the same. Under a fourth condition, the temperature of the substrate support 14 is set to a lower temperature than the temperature at which the substance forming the precursor layer PC is adsorbed on the entire surface of the substrate W during step ST11 when the other processing conditions are the same. A fifth condition may be used when step ST11 involves plasma generation. Under the fifth condition, the absolute value of RF power (at least one of first RF power or second RF power) is set to a lower value than the absolute value at which the substance forming the precursor layer PC is adsorbed on the entire surface of the substrate W when the other processing conditions are the same.

To form the protective layer PL shown in FIG. 9B, at least one of the first to fifth conditions below may be satisfied in step ST13. Under a first condition, the gas pressure in the chamber 10 is set to a lower pressure than the pressure at which a reaction of the substance contained in the second gas with the substance forming the precursor layer PC completes across the entire precursor layer PC during step ST13 when the other processing conditions are the same. Under a second condition, the processing duration for step ST13 is set to a shorter duration than the processing duration for which a reaction of the substance contained in the second gas with the substance forming the precursor layer PC completes across the entire precursor layer PC when the other processing conditions are the same. Under a third condition, the dilution ratio of the second gas containing the substance forming the protective layer PL is set to a higher ratio than the dilution ratio at which a reaction of the substance contained in the second gas with the substance forming the precursor layer PC completes across the entire precursor layer PC when the other processing conditions are the same. Under a fourth condition, the temperature of the substrate support 14 is set to a lower temperature than the temperature at which a reaction of the substance contained in the second gas with the substance forming the precursor layer PC completes across the entire precursor layer PC during step ST13 when the other processing conditions are the same. A fifth condition may be used when step ST13 involves plasma generation. Under the fifth condition, the absolute value of RF power (at least one of first RF power or second RF power) is set to a lower value than the absolute value at which a reaction of the substance contained in the second gas with the substance forming the precursor layer PC completes across the entire surface of the precursor layer PC when the other processing conditions are the same.

In another embodiment, CVD may be used for film deposition in step ST1 included in the method MT. In step ST1, CVD may be plasma CVD or thermal CVD. When CVD is used for the film deposition in step ST1, a film deposition gas containing the sulfur-containing substance described above for the first gas and the second gas is supplied into the chamber 10. The film deposition gas may further contain the carbon-containing substance or the silicon-containing substance described above for the first gas and the second gas. The film deposition gas may include at least one of a noble gas (e.g., a He gas, an Ar gas, a Ne gas, or a Xe gas), $H_2$, $O_2$, $H_2O$, $N_2$, or an inorganic compound with an N—H bond described above.

Figure 10:
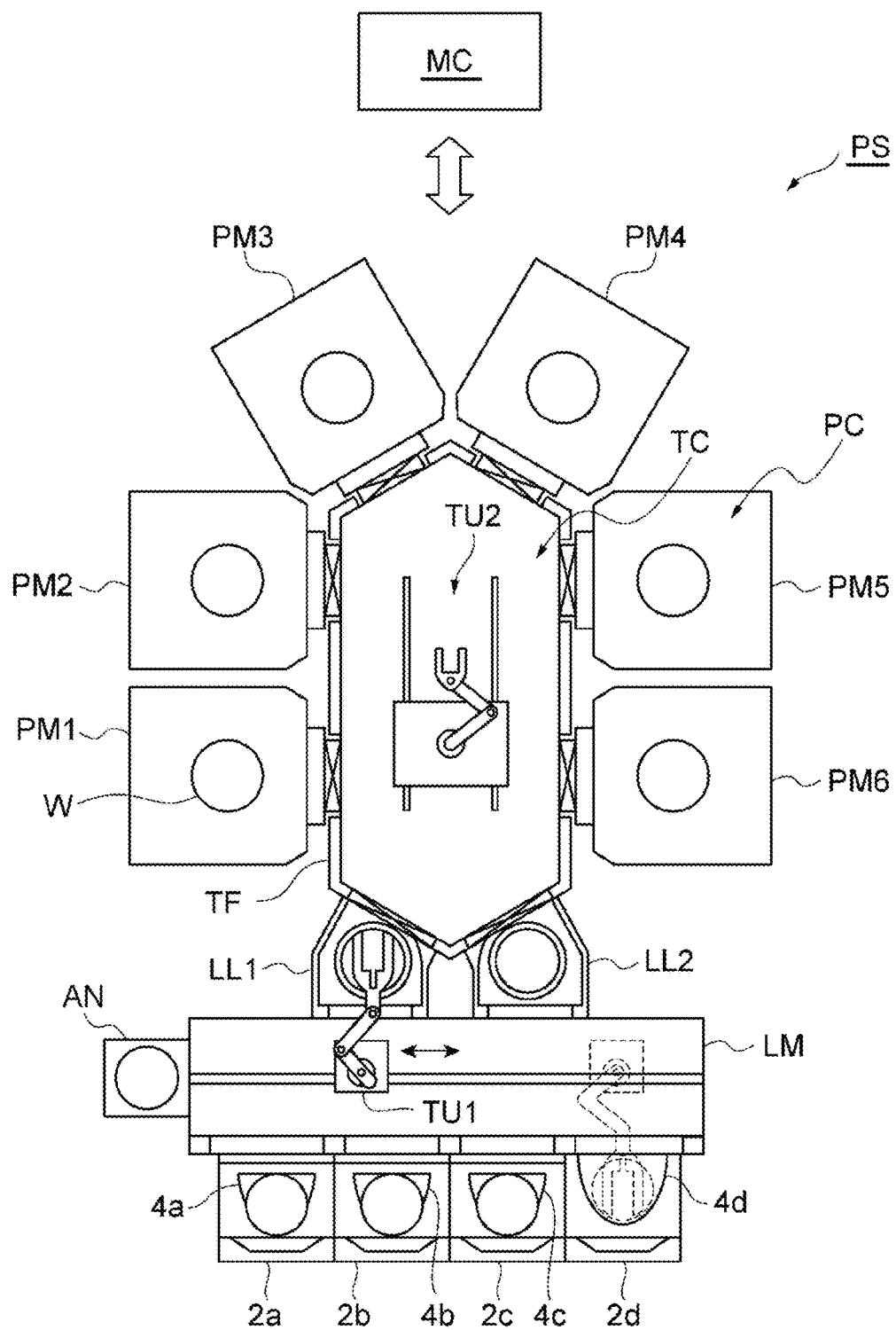
FIG. 10 is a diagram of a substrate processing system according to an exemplary embodiment.

Referring now to FIG. 10, the method MT may be implemented by a substrate processing system including a film deposition apparatus and a plasma processing apparatus. FIG. 10 is a diagram of a substrate processing system according to an exemplary embodiment. The method MT may be implemented by a substrate processing system PS shown in FIG. 10.

The substrate processing system PS includes tables 2a to 2d, containers 4a to 4d, a loader module LM, an aligner AN, loadlock modules LL1 and LL2, process modules PM1 to PM6, a transfer module TF, and a controller MC. The substrate processing system PS may include one or more tables, containers, and loadlock modules. The substrate processing system PS may include two or more process modules.

The tables 2a to 2d are arranged along one edge of the loader module LM. The containers 4a to 4d are mounted on the respective tables 2a to 2d. The containers 4a to 4d each are a container called a front-opening unified pod (FOUP). The containers 4a to 4d store substrates W.

The loader module LM includes a chamber. The chamber in the loader module LM has an atmospheric pressure. The loader module LM includes a transfer unit TU1, which may be an articulated robot controlled by the controller MC. The transfer unit TU1 transfers a substrate W through the chamber in the loader module LM. The transfer unit TU1 transfers the substrate W between the containers 4a to 4d and the aligner AN, between the aligner AN and the loadlock modules LL1 and LL2, and between the loadlock modules LL1 and LL2 and the containers 4a to 4d. The aligner AN is connected to the loader module LM to adjust (correct) the position of the substrate W.

The loadlock modules LL1 and LL2 are located between the loader module LM and the transfer module TF. The loadlock modules LL1 and LL2 each serve as a preliminary decompression chamber.

The transfer module TF is connected to the loadlock modules LL1 and LL2 via corresponding gate valves. The transfer module TF includes a decompressible transfer chamber TC. The transfer module TF includes a transfer unit TU2, which may be an articulated robot controlled by the controller MC. The transfer unit TU2 transfers the substrate W through the transfer chamber TC. The transfer unit TU2 may transfer the substrate W between the loadlock modules LL and LL2 and the process modules PM1 to PM6, and between any two of the process modules PM1 to PM6.

The process modules PM1 to PM6 are processing apparatuses dedicated to intended substrate processing. One of the process modules PM1 to PM6 is a film deposition apparatus used to form the protective layer PL in step ST1. The film deposition apparatus is a plasma processing apparatus such as the plasma processing apparatus 1 or another plasma processing apparatus when step ST1 involves plasma generation. The film deposition apparatus may eliminate a plasma generator when the protective layer PL is formed without involving plasma generation in step ST1.

Another one of the process modules PM1 to PM6 is a substrate processing apparatus such as the plasma processing apparatus 1 or another plasma processing apparatus. The substrate processing apparatus is used to etch the film EF in step ST2. The substrate processing apparatus may be used to perform etching in step STa. In some embodiments, still another one of the process modules PM1 to PM6 serves as a substrate processing apparatus and may be used to perform etching in step STa.

In the substrate processing system PS, the controller MC controls the components of the substrate processing system PS. The controller MC controls the film deposition apparatus to form the protective layer PL in step ST1. After the protective layer PL is formed, the controller MC controls the substrate processing apparatus to etch the film EF to increase the depth of the recess OP. The substrate processing system PS can transfer the substrate W between the process modules without exposing the substrate W to the atmosphere.

Although the exemplary embodiments have been described above, the embodiments are not restrictive, and various additions, omissions, substitutions, and changes may be made. The components in the different exemplary embodiments may be combined to form another exemplary embodiment.

The substrate processing apparatus implementing the method MT may include any type of plasma processing apparatus. The substrate processing apparatus implementing the method MT may be, for example, a capacitively coupled plasma processing apparatus other than the plasma processing apparatus 1. The substrate processing apparatus implementing the method MT may be an inductively coupled plasma processing apparatus, an electron cyclotron resonance (ECR) plasma processing apparatus, or a plasma processing apparatus that generates plasma using surface waves such as microwaves. When the method MT uses no plasma, the substrate processing apparatus may eliminate the plasma generator.

The film EF may be formed from metal, metal oxide, or chalcogenide. The film EF may be etched with plasma generated from a process gas containing, for example, a halogen-containing gas in steps STa and ST2.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure is defined by the appended claims.

REFERENCE SIGNS LIST

1 Plasma processing apparatus
PS Substrate processing system
W Substrate
EF Film
PL Protective layer

What is claimed is:

1. An etching method, comprising:
   forming a protective layer on a surface of a side wall defining a recess in a substrate, the protective layer containing sulfur atoms; and
   etching a film in the substrate to increase a depth of the recess after forming the protective layer,
   wherein the forming the protective layer includes:
   forming a precursor layer on the surface of the side wall with a first gas, and
   forming the protective layer from the precursor layer with a second gas, and
   the first gas contains a sulfur-containing substance.

2. The etching method according to claim 1, wherein a plurality of film deposition cycles each including the forming the precursor layer and the forming the protective layer are performed sequentially.

3. The etching method according to claim 2, wherein the plurality of film deposition cycles include at least one film deposition cycle in which the forming the precursor layer is performed under a condition different from a condition under which the forming the precursor layer is performed in at least another one of the plurality of film deposition cycles.

4. The etching method according to claim 2, wherein the plurality of film deposition cycles include at least one film deposition cycle in which the forming the protective layer from the precursor layer is performed under a condition different from a condition under which the forming the protective layer from the precursor layer is performed in at least another one of the plurality of film deposition cycles.

5. The etching method according to claim 1, wherein the second gas contains $H_2O$, an inorganic compound with an N—H bond, a carbon-containing substance, a silicon-containing substance, or a sulfur-containing substance.

6. The etching method according to claim 5, wherein
the sulfur-containing substance contained in the second gas includes an isothiocyanate compound, a sulfonyl compound, a thiol compound, a thiophene compound, an episulfide compound, a disulfide compound, a sulfide compound, a thiocarbonyl compound, or a sulfide gas.

7. The etching method according to claim 1, wherein
the second gas contains at least one of $H_2$, $O_2$, or $N_2$, and
the protective layer is formed from the precursor layer receiving a chemical species in plasma generated from the second gas.

8. The etching method according to claim 1, wherein
the sulfur-containing substance contained in the first gas includes an isothiocyanate compound, a sulfonyl compound, a thiol compound, a thiophene compound, an episulfide compound, a disulfide compound, a sulfide compound, a thiocarbonyl compound, or a sulfide gas.

9. The etching method according to claim 1, wherein
a plurality of cycles each including the forming the protective layer and the etching the film are performed sequentially.

10. The etching method according to claim 9, wherein
the plurality of cycles include at least one cycle in which the forming the protective layer is performed under a condition different from a condition under which the forming the protective layer is performed in at least another one of the plurality of cycles.

11. The etching method according to claim 9, wherein
the plurality of cycles include at least one cycle in which the etching the film is performed under a condition different from a condition under which the etching the film is performed in at least another one of the plurality of cycles.

12. The method according to claim 1, wherein
the film includes a silicon-containing film or an organic film.

13. An etching method, comprising:
forming a protective layer on a surface of a side wall defining a recess in a substrate, the protective layer containing sulfur atoms; and
etching a film in the substrate to increase a depth of the recess after forming the protective layer, wherein
the protective layer is formed by chemical vapor deposition with a film deposition gas containing a sulfur-containing substance, and
the sulfur-containing substance includes an isothiocyanate compound, a sulfonyl compound, a thiophene compound, an episulfide compound, a disulfide compound, a sulfide compound, a thiocarbonyl compound, or a sulfide gas.

14. The etching method according to claim 13, wherein
the film deposition gas further contains a carbon-containing substance, a silicon-containing substance, $H_2$, $O_2$, $H_2O$, $N_2$, an inorganic compound with an N—H bond, or a noble gas.

* * * * *